(12) United States Patent
Hattass et al.

(10) Patent No.: US 11,480,665 B2
(45) Date of Patent: Oct. 25, 2022

(54) STABILIZED LIDAR SYSTEM AND METHOD FOR STABILIZATION

(71) Applicant: Robert Bosch GmbH, Stuttgart (DE)

(72) Inventors: Mirko Hattass, Stuttgart (DE); Timo Knecht, Mundelsheim (DE)

(73) Assignee: Robert Bosch GmbH, Stuttgart (DE)

( * ) Notice: Subject to any disclaimer, the term of this patent is extended or adjusted under 35 U.S.C. 154(b) by 760 days.

(21) Appl. No.: 16/444,054

(22) Filed: Jun. 18, 2019

(65) Prior Publication Data

US 2020/0033459 A1 Jan. 30, 2020

(30) Foreign Application Priority Data

Jun. 20, 2018 (DE) .......................... 102018209995.2

(51) Int. Cl.
*G01S 7/497* (2006.01)
*H01S 5/0687* (2006.01)

(52) U.S. Cl.
CPC ............ *G01S 7/497* (2013.01); *H01S 5/0687* (2013.01)

(58) Field of Classification Search
CPC ................................. G01S 7/497; H01S 5/0687
USPC ........................................................ 398/5.01
See application file for complete search history.

(56) References Cited

U.S. PATENT DOCUMENTS

| | | | |
|---|---|---|---|
| 5,781,572 A | 7/1998 | Tahara et al. | |
| 6,154,474 A * | 11/2000 | Yoshida | ................ H01S 5/0687 372/32 |
| 6,289,028 B1 | 9/2001 | Munks et al. | |
| 6,529,534 B1 | 3/2003 | Yasuda | |
| 7,534,994 B2 * | 5/2009 | Check | ........................ G01J 1/32 250/238 |
| 2002/0063160 A1 * | 5/2002 | Krichever | .............. G06K 19/04 235/462.32 |
| 2003/0026532 A1 * | 2/2003 | Murry | ....................... G01J 9/00 385/27 |

(Continued)

FOREIGN PATENT DOCUMENTS

| | | | | |
|---|---|---|---|---|
| DE | 102010007485 A1 * | 8/2011 | ............... | B44C 5/00 |
| DE | 102010007495 A1 * | 8/2011 | ....... | H01L 31/02021 |

(Continued)

OTHER PUBLICATIONS

Chen et al; A wide-range tunable wavelength stabilization technique for semiconductor lasers; May 2021; Current optics and Photonics, vol. 5 No. 4; pp. 1-7. (Year: 2021).*

*Primary Examiner* — Amritbir K Sandhu
(74) *Attorney, Agent, or Firm* — Norton Rose Fulbright US LLP; Gerard Messina

(57) ABSTRACT

A stabilized LiDAR system and a method for stabilization. The LiDAR system includes a laser, the laser being designed for emission of monochromatic LiDAR radiation within a wavelength working range; a thermocouple element configured to set the working temperature of the laser; a means for evaluation, designed to determine, from the radiation emitted by the laser, a measure for the deviation from an actual wavelength of the radiation to a setpoint wavelength within the wavelength working range of the laser; and a means for regulation, designed to control the thermocouple element on the basis of the measure of deviation determined by the means for evaluation, in such a way that the working temperature of the laser is set to a value, at which the emitted monochromatic LiDAR radiation corresponds to the setpoint radiation.

16 Claims, 7 Drawing Sheets

(56) References Cited

U.S. PATENT DOCUMENTS

| | | | |
|---|---|---|---|
| 2005/0018722 A1* | 1/2005 | Check | G02B 26/106 |
| | | | 372/24 |
| 2010/0246621 A1* | 9/2010 | Kuzukami | H01S 5/0687 |
| | | | 372/38.02 |
| 2014/0241726 A1* | 8/2014 | Ho | H04B 10/40 |
| | | | 398/79 |
| 2015/0076990 A1* | 3/2015 | Uesaka | G01J 1/4257 |
| | | | 315/151 |
| 2018/0120433 A1* | 5/2018 | Eichenholz | H01S 3/094076 |
| 2018/0367215 A1* | 12/2018 | Nguyen | G01K 11/22 |
| 2020/0033459 A1* | 1/2020 | Hattass | G01S 7/497 |

FOREIGN PATENT DOCUMENTS

| | | |
|---|---|---|
| DE | 102016213446 A1 | 1/2018 |
| JP | 4239507 B2 * | 3/2009 |

* cited by examiner

STABILIZED LIDAR SYSTEM AND METHOD FOR STABILIZATION

CROSS REFERENCE

The present application claims the benefit under 35 U.S.C. § 119 of German Patent Application No. DE 102018209995.2 filed on Jun. 20, 2018, which is expressly incorporated herein by reference in its entirety.

FIELD

The present invention relates to a stabilized LiDAR system and a method for stabilization. The present invention relates in particular to a LiDAR system having improved temperature regulation for suppressing optical crosstalk and a method for wavelength stabilization in a corresponding LiDAR system.

BACKGROUND INFORMATION

Scanning LiDAR systems for detection of surroundings generally include a transmission unit and a receiving unit. The transmission unit generally generates a beam, which illuminates a certain portion of the scenery with the aid of a laser. The photons incident there are reflected or scattered and detected with the aid of the receiving optical system. Due to the scattering of the photons into a large space angle at the particular target (so-called Lambert target) the number of the photons which may be detected by the receiving unit decline very rapidly with the distance from the target. Since the receiver in the receiving unit (detector, for example) is influenced by additional disturbances at the same time, separation of the reflected signal from the noise becomes increasingly more difficult or impossible with an increase in distance. One important disturbance for LiDAR systems may be background light, which strikes the scenery at the same time. This is also imaged on the detector via the receiving optical system and results in a noise contribution.

This contribution may be minimized if a band-pass filter is used as a filter element upstream from the receiving optical system. This band-pass filter has a preferably narrow passband around the wavelength of the emitted LiDAR radiation, so that background light strikes the detector only from a very narrow spectral band range. However, using a preferably narrow filter to reduce background light requires the use of a laser having a preferably stable working wavelength.

Although it is certainly possible to use such lasers, the types of suitable lasers are greatly limited. If semiconductor lasers are to be used, the process variations from the semiconductor process as well as the temperature at which the laser is operated have an influence on the emitted wavelength. If all possible process variations and temperature drifts are to be taken into account in selecting an appropriate filter, only a very broad filter may be used, if necessary, allowing a great deal of background light to pass through accordingly and thereby limiting the range of the LiDAR system.

This problem may be improved, for example, by direct selection of the required lasers from the production process, but this is associated with much higher costs. Temperature influences may be reduced by temperature regulation in particular (see FIG. 1), by adequately regulating the temperature of the transmission unit, for example, by using a Peltier element and/or a heating resistor. However, it is problematic here that the relationship between the measured temperature at one site of the laser unit and the actually relevant temperature at the laser emitter chip, (i.e., in particular the temperature of the active region of the laser), is unknown or is known only approximately. This limits the effective precision of such a temperature regulation and thus also limits the minimally achievable filter width.

SUMMARY

According to the present invention, a stabilized LiDAR system and a method for wavelength stabilization are provided.

An example LiDAR system according to the present invention includes a laser, the laser being designed for emitting monochromatic LiDAR radiation within a wavelength working range; a thermocouple element, configured to set the working temperature of the laser; a means for evaluation, designed to determine a measure for the deviation from an actual wavelength of the radiation to a setpoint wavelength within the wavelength working range of the laser from the radiation emitted by the laser; and a means for regulation, designed to control the thermocouple element on the basis of the measure of deviation determined by the means for evaluation, in such a way that the working temperature of the laser is set to a value at which the emitted monochromatic LiDAR radiation corresponds to the setpoint wavelength.

The laser may preferably be a semiconductor laser (edge emitter, vertical cavity surface emitting laser, VCSEL). The laser (or the laser emitter chip) is preferably situated on a laser module. A laser module is understood in particular to be a chip carrier for a laser emitter chip (laser die). However, a module may also include other mechanical and/or electronic components. The wavelength working range of the laser is determined on the basis of a spectrally accessible area of the laser, at which stable emission still occurs with the aid of tuning, in particular based on its working temperature. The actual wavelength is understood to be the instantaneous wavelength of the radiation emitted by the laser. The setpoint wavelength (also referred to as the target wavelength or nominal wavelength) is a preferred wavelength at which the laser is to be emitting. The setpoint wavelength preferably corresponds to the filter wavelength of the receiving filter used for an associated receiving unit of the LiDAR system. The setpoint wavelength may be fixedly predetermined based on externally established system parameters or may be established by the LiDAR system itself based on an appropriate measurement.

A thermocouple element is understood in particular to be a heating element or a cooling element. It may be a Peltier element or a heating resistor, for example. The thermocouple element may be used for both active heating and cooling. The thermocouple element may also be designed in particular as a combination of corresponding elements for heating and cooling. The thermocouple element is configured to set the working temperature of the laser. This may be accomplished in particular by the thermocouple element being in thermal contact with the laser module, and a heating or cooling effect of the thermocouple element is transferred to the laser via the laser module. However, the thermocouple element may also directly contact the laser emitter chip thermally or be integrated into a laser emitter chip.

The means for evaluation determines from the radiation emitted by the laser a measure for the deviation from an actual wavelength of the radiation to a setpoint wavelength within the wavelength working range of the laser. The measure for the deviation may be in particular a deviation signal derived from said deviation, for example, as a voltage value. In the simplest case, the means for evaluation may directly determine the wavelength of the laser radiation (for example, with the aid of a spectrometer or an interferometer) and generate the so-called control difference as a deviation signal from the difference from the nominal setpoint wavelength.

The means for evaluation may additionally be configured to make a determination of the setpoint wavelength to the transmission maximum of a receiving filter associated with the LiDAR system. In particular, the means for evaluation may therefore include a means for spectral measurement of the receiving filter. The means for spectral measurement of the receiving filter may be in particular a device, which measures the receiving filter spectrally with the aid of a defined reference radiation. The defined reference radiation may be in particular a LiDAR radiation obtainable by sequential wavelength-selective tuning of the laser in the dark phases of the LiDAR system, or it may be the light of a spectrally broadband light source. Implementation of the measuring/regulating method may be further improved in this way by offsetting not only the variations of the laser and the temperature variations but also manufacturing-induced variations in the receiving filter.

The means for regulation (controller) may be, for example, a PID controller or a PD controller. Based on the deviation signal (for example, control difference) of the means for evaluation, the thermocouple element (final control element) is controlled by a corresponding control variable in such a way that the working temperature (manipulated variable) of the laser is set to a value at which the emitted monochromatic LiDAR radiation corresponds to the setpoint wavelength. Corresponding means for regulation are sufficiently well known to those skilled in the art.

In the present invention includes the diversion of the control chain, which is customary in the related art, by measuring the wavelength instead of the temperature. The laser process variation in accordance with the present invention may therefore be compensated by adjusting the working temperature of the laser. In addition, temperature drifts occurring during operation may be offset with high precision since the effect of the temperature (i.e., the wavelength) is present directly as a control variable in a control chain according to the present invention, not just the deviation from the target temperature. A regulation solely on the basis of the temperature as the control variable is more error prone since the association between target temperature and setpoint wavelength, which is used for the regulation, may vary over time, and the system performance would therefore deteriorate progressively. However, in a control chain according to the present invention, the control is directed directly to the target value, i.e., the setpoint wavelength. Therefore, this definitely improves the stabilization in both the short term and the long term in comparison with the related art.

However, the temperature may additionally still be determined on the laser module, for example. A LiDAR system according to the present invention may therefore include a sensor for determining the temperature of the laser. In addition, a parallel monitoring system in particular may be implemented, which ensures the consistency of the temperature measurement and the wavelength measurement. The parallel monitoring system may be integrated into the means for evaluation in particular. If there are inconsistencies, the generated deviation signal may be adapted to be fault tolerant, for example, or the means for evaluation may be switched to an error mode.

A LiDAR system according to the present invention may be used in a variety of different LiDAR configurations including a filter element in the receive path, which is selective for the laser wavelength of the transmission unit. However, the present invention is suitable in particular for rotating LiDAR systems. Such systems mostly have a stator and a rotor. The rotor generally includes a rotary disk, on which the imaging optical system of the transmit path is situated. A determination of a measure for the deviation according to the present invention may preferably be carried out near the laser, i.e., on the rotor or the rotary disk, for example. However, the determination may also be carried out on the stator by emitting a pulse when the laser passes over a corresponding means for evaluation. This requires a synchronization of the rotation with the [pulse] bombardment point in time. The means for evaluation is therefore preferably synchronized with the LiDAR scanning.

In a first preferred specific embodiment of the present invention, the means for evaluation includes two monitor diodes configured to determine the intensity of a diverted portion of the LiDAR radiation emitted by the laser, the radiation passing through an optical filter element before striking the monitor diodes, which, starting from the setpoint wavelength within the wavelength working range of the laser, have passbands in different spectral directions, the passbands of each of the two filter elements including the setpoint wavelength and a wavelength range adjacent to the setpoint wavelength on both sides, preferably corresponding to between 0.001% and 35% of the width of the wavelength working range of the laser; and means for determining a measure of deviation designed to determine a measure for the deviation from the actual wavelength to the setpoint wavelength from the intensities determined on the two monitor diodes with the aid of the known transmission behavior of the filter elements.

The laser wavelength is thus measured via two monitor diodes (for example, photodiodes, pin diodes, APDs, SiPMs) including upstream optical filters of a complementary design. The output signals of these monitor diodes may be used to measure the laser wavelength resulting from the instantaneous working temperature of the laser.

The total width of the passband of a filter element may be substantially broader than the total width of the wavelength range adjacent on both sides around the setpoint wavelength (double-adjacent wavelength range). For evaluation using two filter elements, it is important for the setpoint wavelength to be in the passband of the two filter elements (in different spectral directions of the passbands), in such a way that they have a shared passband around the setpoint wavelength, and conclusions about the deviation between the actual wavelength and the setpoint wavelength are made possible based on the particular transmission behavior in the case of an actual wavelength.

The passband is understood in particular to be a filter range whose transmission over an extended wavelength range amounts to at least 10%, preferably at least 5%, and even more preferably at least 2%. A wavelength range adjacent to the setpoint wavelength is preferably adjacent to a band edge of the passband at one side. Accordingly, it is preferred for the setpoint wavelength in the first filter element to be located in the ascending portion of the passband and in the second filter element, to be located in the descending portion of the passband, the ascending and descending portions being understood to refer to the transition from the band edge to the main portion of the passband and/or from the main portion of the passband to the band edge. In this case, the wavelength-dependent transmission behavior of the filter elements in the range around the setpoint wavelength allows conclusions about the deviation between the actual wavelength and the setpoint wavelength.

The wavelength range of a filter element adjacent to the setpoint wavelength on both sides thus preferably includes a total width (full width at half maximum, FWHM) between 0.002% and 70% of the width of the wavelength working range of the laser. A total width between 0.02% and 50% of the width of the wavelength working range of the laser is more preferred, more preferably between 0.02% and 20%, more preferably between 0.1% and 10%, more preferably between 0.2% and 5%, and even more preferably between 0.5% and 1% of the width of the wavelength working range of the laser.

A portion of the power from the transmission beam is preferably directed at the monitor diodes. This may take place, for example, by using a defined beam splitter or by including a scattered reflex from one of the optical systems (the power of the transmission beam is easily sufficient for a signal to a monitor diode). A filter element is situated upstream from each monitor diode. The passband of the filter elements is selected in such a way that the first filter essentially allows wavelengths shorter than the desired setpoint wavelength to pass, and the second filter essentially allows wavelengths longer than the desired setpoint wavelength to pass. In the range of the setpoint wavelength, the two filter elements have an overlapping passband. The ratio of the radiation intensities measured on the monitor diodes thus allows conclusions about the actual wavelength in the case of known filter characteristics of the individual filter elements. However, the deviation signal generated by the means for evaluation need not be ascertained here directly from the nominal value of the wavelength difference, but rather the measure for the deviation from an actual wavelength of the radiation to be determined to a setpoint wavelength is already present via the intensity measurement. A corresponding voltage signal for the regulation is directly derivable therefrom. In this specific embodiment, the use of a spectrometer for determining the nominal value of the wavelength may be dispensed with.

In the first preferred specific embodiment, the means for determining the measure of deviation is preferably designed to determine the differential signal ($S=I_1-I_2$) as a measure of deviation from the intensities determined on the two monitor diodes and/or to determine the sum signal for monitoring the total power. Reference is made to the relevant literature for the details about generation of deviation signals.

A heating element or cooling element may then be energized by the means for regulation, in such a way that the required temperature for the setpoint wavelength is established. Since it is possible to control the signal directly at the target signal in this way, paths not known precisely are automatically also taken into account in the control path. In addition, the sum signal may be used to monitor the total power of the laser. The temperature may also be determined on the component, and thus a monitoring system ensuring consistency in the temperature measurement and wavelength measurement may be implemented in parallel.

The means for evaluation preferably includes a third monitor diode configured to determine, independently of wavelength, the intensity of a diverted portion of the LiDAR radiation emitted by the laser. This may be implemented in particular by a monitor diode without an upstream filter element. For offsetting fluctuations in intensity of the laser, the signal of another monitor diode may therefore be used without an upstream filter element to enable standardization of the total signal. "Independently of wavelength" here means that there are no significant differences in spectral sensitivity of the monitor diode within the wavelength working range of the laser. Reference is made to relevant literature with regard to the topic of signal standardization.

In a second preferred specific embodiment of the present invention, the means for evaluation includes a monitor diode configured to determine the intensity of a diverted portion of the LiDAR radiation emitted by the laser, the radiation passing through an optical filter element having a passband with a clearly assignable transmission within the wavelength working range; and a means for determining, from the intensity determined on the monitor diode, a measure of deviation, designed to determine a measure for the deviation from the actual wavelength to the setpoint wavelength with the aid of the known transmission behavior of the filter element.

This specific embodiment is based on the fact that it is basically also possible to implement the generation of a deviation signal with only one monitor diode. For this purpose, a descending portion or an ascending portion of the passband of a filter element used may be selected to be wide enough that, within this range, the wavelength would be clearly assignable from the transmission of the filter element. However, in this exemplary embodiment, a measurement is less possible linearly than in a differential method according to the first preferred specific embodiment.

The means for evaluation of this specific embodiment additionally preferably includes a second monitor diode configured to determine, independently of wavelength, the intensity of the diverted portion of the LiDAR radiation emitted by the laser. This may be implemented in particular by a monitor diode without an upstream filter element. For offsetting fluctuations in laser intensity, the signal of another monitor diode without an upstream filter element may be used for the purpose of enabling a standardization of the total signal. "Independently of wavelength" here means that there are no important differences in the spectral sensitivity of the monitor diodes within the wavelength working range of the laser. Reference is made to the relevant literature with regard to the topic of signal standardization.

Another aspect of the present invention relates to a method for wavelength stabilization of a LiDAR system. This method presupposes the essential features of the aforementioned device for its implementation. To this extent, providing a corresponding LiDAR system is advantageous for implementation of the method. Nevertheless, the basic idea of the present invention to regulate the control chain directly via the target variable (wavelength) may also be implemented with means other than those referenced above for the device.

The method for wavelength stabilization therefore includes the determination of a measure for the deviation from an actual wavelength of the radiation to a setpoint wavelength within the wavelength working range of the laser (implemented, for example, by a corresponding means for evaluation); and controlling of the thermocouple element on the basis of the measure of deviation determined in advance, so that the working temperature of the laser is set to a value at which the emitted monochromatic LiDAR radiation corresponds to the setpoint wavelength.

In a first preferred specific embodiment of the method, the setpoint wavelength is set to the transmission maximum of a receiving filter (for example, a laser line filter) associated with the LiDAR system, a portion of the LiDAR radiation emitted by the laser being deflected in a dark phase of the LiDAR system in a detector of a receiver unit associated with the LiDAR system situated behind the receiving filter, (deflected, for example, via a reflector inside the LiDAR system), and the wavelength-dependent transmission of the receiving filter is measured by sequential wavelength-selective tuning of the LiDAR radiation of the laser in the dark phases of the LiDAR system.

Dark phases are understood to be periods during which the LiDAR system does not emit any light into the surroundings, i.e., it is passive. This may refer to a dormancy of the system in particular. In a rotating LiDAR system, which covers a scan angle of less than 360°, there also exists in most cases a dark phase, during which the transmitting and receiving optical systems are directed at the back side of the housing. In this dark phase, energy may be diverted from the transmit path to the receive path by deflecting the beam. The occurrence of a dark phase is necessary to be able to use the receive path for measuring the receiving filter without disturbing or influencing the actual detection of the surroundings.

Sequential wavelength-selective tuning of the LiDAR radiation of the laser in the dark phases of the LiDAR system may take place, for example, by setting different wavelengths in the wavelength working range of the laser during one dark phase or distributed over multiple dark phases. If the detector response (from the actual receiving optical system) is then measured in dark phases as a function of a fixed set temperature of the laser, then the bandpass response of the receiving filter may be measured directly during its use. In parallel thereto, for example, the signal of two monitor diodes according to the present invention in the transmit path may be recorded. After conclusion of this measurement, a target value for the wavelength measurement (or a target temperature) in the transmit path may be established, and the regulation may be carried out using this target value.

The advantage of this method is that it is possible not only to capture the temperature variations and variations of the laser during the manufacturing process, but also to capture the variations during production of the receiving filters. On the whole, this permits significant reduction in costs and assembly effort during production.

In a second preferred specific embodiment of the method, the setpoint wavelength is set to the transmission maximum of a receiving filter associated with the LiDAR system, a portion of the light of a spectrally broadband light source reflected behind the receiving filter being measured spectrally to determine the transmission maximum of the receiving filter, the spectral band including the wavelength working range of the laser. The spectrally broadband light source may preferably be a white light source or a light-emitting diode (LED).

To fine-tune the target value for the regulation to the receiving filter, it is therefore possible to use a broadband light source (instead of the LiDAR radiation of the laser) and to evaluate its reflex on an internal structure behind the input filter. In a rotating LiDAR system, the broadband light source may preferably be situated on the stator.

Advantageous refinements of the present invention are described herein.

BRIEF DESCRIPTION OF THE DRAWINGS

Exemplary embodiments of the present invention will now be explained in greater detail with reference to the figures and the description below.

DETAILED DESCRIPTION OF EXAMPLE EMBODIMENTS

Figure 1:
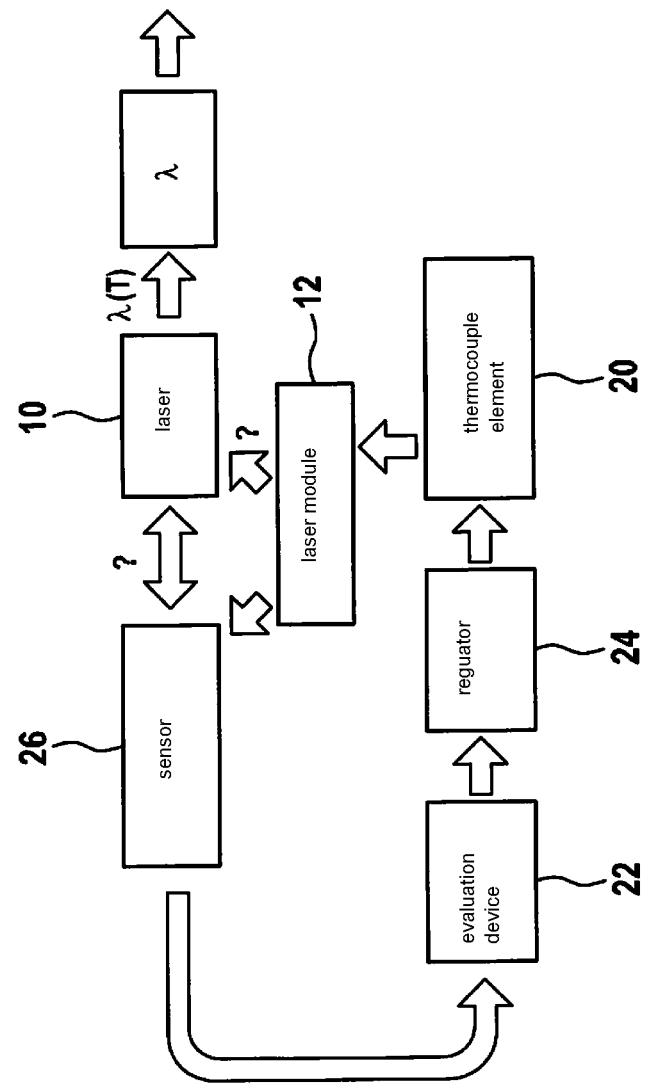
FIG. 1 shows a schematic diagram of a control chain for laser stabilization in the related art.

FIG. 1 shows a schematic diagram of a control chain for laser stabilization in the related art. The arrows drawn in the figure indicate the dependencies between the individual components of the control chain. The control chain shown in the figure includes a laser 10, laser 10 being designed for emission of monochromatic LiDAR radiation (wavelength $\lambda$) within a wavelength working range $\lambda(T)$; a thermocouple element 20 being configured to set working temperature T of laser 10; a means for evaluation 22 being designed to determine a measure for the deviation from actual temperature $T_{actual}$ to a setpoint temperature $T_{setpoint}$ from actual temperature $T_{actual}$ of laser 10 measured by a sensor 26; and a means for regulation 24 being designed to control thermocouple element 20 on the basis of the measure of deviation determined by the means for evaluation 22 in such a way that working temperature T of laser 10 is set to a value corresponding to setpoint temperature $T_{setpoint}$. Laser 10 may include in particular a laser emitter chip of a semiconductor laser (diode laser, for example). The laser emitter chip and sensor 26 are generally situated together on one laser module 12.

Thermocouple element 20 is controlled by means for regulation 24 and acts on the temperature of laser 10. Sensor 26 measures the temperature of laser module 12. It is problematic here that the relationship between the temperature measured by sensor 26 at one site of the laser module 12 and the temperature which is actually relevant on laser 10 (i.e., in particular the temperature of the active area of laser 10) is not well known. This limits the effective precision of such a temperature regulation since the emission wavelength of laser 10 is regulated only indirectly with the aid of the setpoint temperature. This has the disadvantage that changes in the system performance (for example, changes in the characteristic line of sensor 26) cannot be monitored and corrected.

Figure 2:
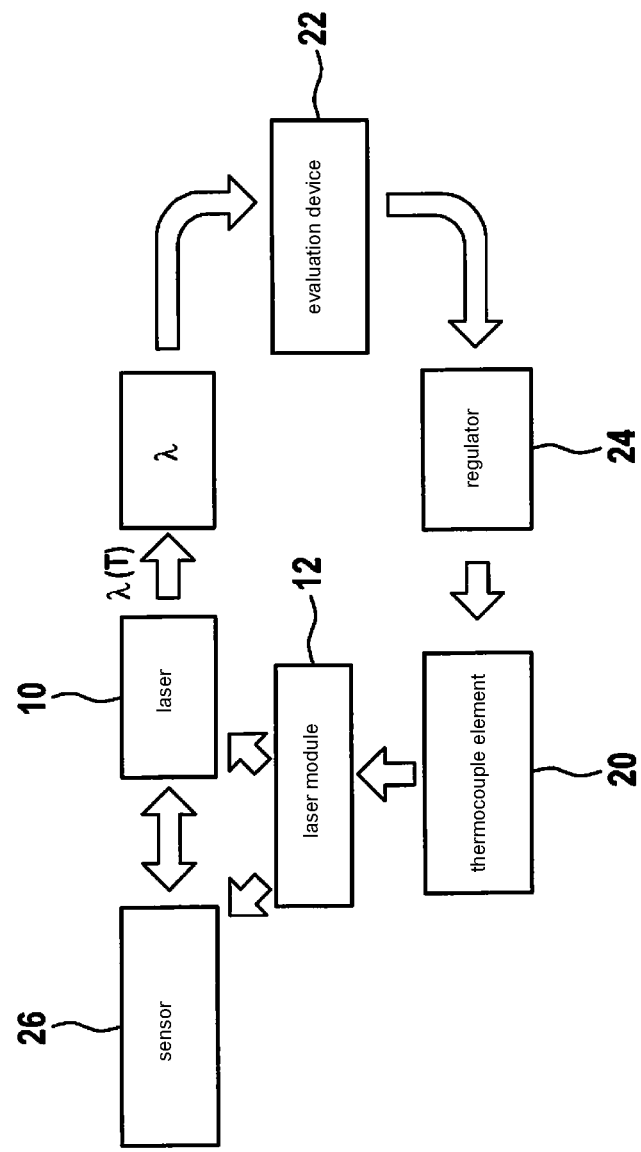
FIG. 2 shows a schematic diagram of a control chain according to the present invention for laser stabilization.

FIG. 2 shows a schematic diagram of a control chain according to the present invention for laser stabilization. The arrows drawn in the figure indicate the dependencies between the individual components of the control chain. The control chain shown includes a laser 10, laser 10 being designed for emission of monochromatic LiDAR radiation (wavelength $\lambda$) within a wavelength working range $\lambda(T)$; a thermocouple element 20 being configured to set operating temperature T of laser 10; a means for evaluation 22 being designed to determine, from the radiation emitted by laser 10, a measure for the deviation from an actual wavelength $\lambda_{actual}$ of the radiation to a setpoint wavelength $\lambda_{setpoint}$ within wavelength working range $\lambda(T)$ of laser 10; and a means for regulation 24 being designed to control thermocouple element 20 on the basis of the measure of deviation determined by the means for evaluation 22 in such a way that working temperature T of laser 10 is set to a value at which the emitted monochromatic LiDAR radiation corresponds to setpoint wavelength $\lambda_{setpoint}$. Laser 10 may include in particular a laser emitter chip of a semiconductor laser (diode laser, for example). The laser emitter chip is generally situated on a laser module 12.

In comparison with a control chain according to FIG. 1, a diversion of the control chain via a measurement of the wavelength instead of the temperature is present here. However, the regulation takes place also via a setting of the temperature of laser 10. A control chain according to the present invention has the advantage that the system is regulated directly to the desired target value (i.e., the wavelength), and therefore changes in system performance may also be monitored and corrected.

Figure 3:
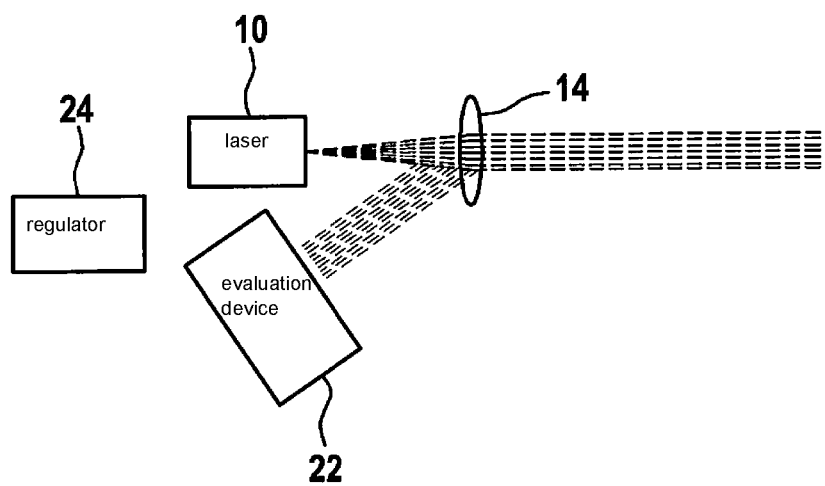
FIG. 3 shows a schematic diagram of one specific embodiment of a device according to the present invention.

FIG. 3 shows a schematic diagram of one specific embodiment of a device according to the present invention. The diagram includes a laser 10, laser 10 being designed for emission of monochromatic LiDAR radiation (wavelength $\lambda$) within a wavelength working range $\lambda(T)$; a means for evaluation 22 being designed to determine, from the radiation emitted by laser 10, a measure for the deviation from an actual wavelength $\lambda_{actual}$ of the radiation to a setpoint wavelength $\lambda_{setpoint}$ within the wavelength working range of the laser; a means for regulation 24 being designed to control thermocouple element 20 on the basis of the measure of deviation determined by means for evaluation 22 in such a way that working temperature T of the laser is set to a value at which the emitted monochromatic LiDAR radiation corresponds to setpoint wavelength $\lambda_{setpoint}$. A portion of the power from the actual transmission beam is directed to the means for evaluation 22, for example, to monitor diodes 30, 32, 40 encompassed by means for evaluation 22. This may take place, for example, by a defined beam splitter or, as presented here, also by including a scattered reflex on a transmission optical system 14.

Figure 4:
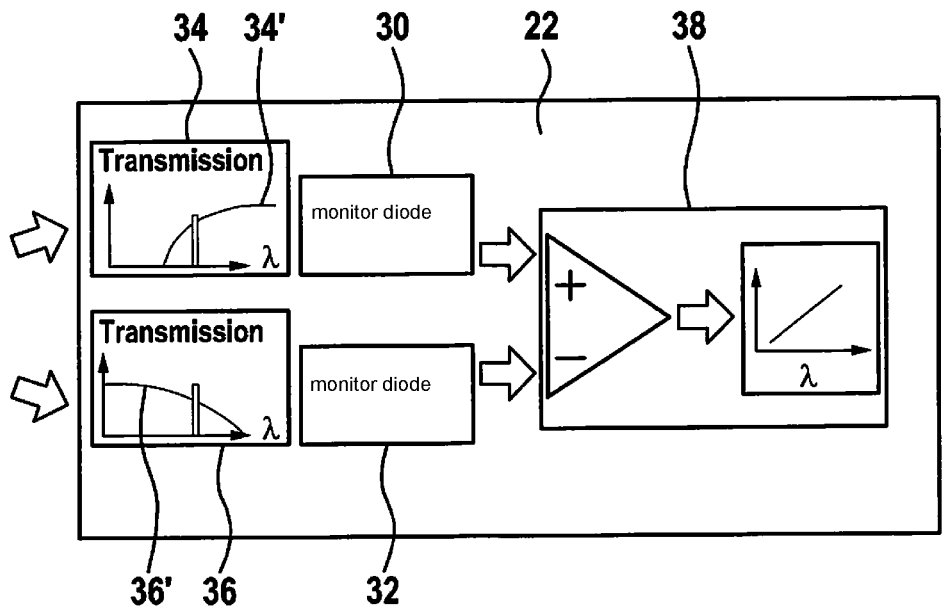
FIG. 4 shows a schematic diagram of the means for evaluation of the first preferred specific embodiment of a device according to the present invention.

FIG. 4 shows a schematic diagram of the means for evaluation 22 of the first preferred specific embodiment of a device according to the present invention. Means for evaluation 22 includes two monitor diodes 30, 32 configured to determine the intensity of a diverted portion of the LiDAR radiation emitted by laser 10, the radiation passing through an optical filter element 34, 36 before striking monitor diodes 30, 32, which, starting from the setpoint wavelength within the wavelength working range of laser 10, have passbands 34', 36' in different spectral directions, the setpoint wavelength being in the ascending portion of passband 34' in first filter element 34 and in the descending portion of passband 36' in second filter element 36; and a means for determining a measure of deviation 38 being designed to determine a measure for the deviation from the actual wavelength to the setpoint wavelength from the intensities determined on the two monitor diodes 30, 32 with the aid of the known transmission behavior of filter elements 34, 36. In the case shown here, the means for determining measure of deviation 38 is designed to determine, from the intensities determined on the two monitor diodes 30, 32, the differential signal as the measure of deviation and/or the sum signal for monitoring the total power (not shown).

Figure 5:
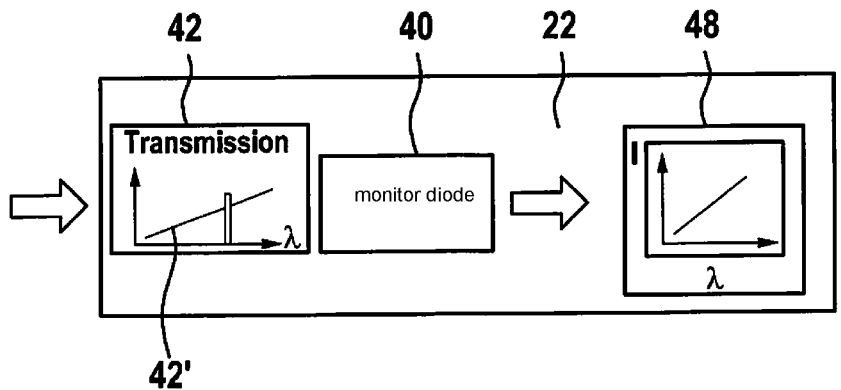
FIG. 5 shows a schematic diagram of the means for evaluation of the second preferred specific embodiment of a device according to the present invention.

FIG. 5 shows a schematic diagram of means for evaluation 22 of the second preferred specific embodiment of a device according to the present invention. Means for evaluation 22 includes a monitor diode 40, configured to determine the intensity of a diverted portion of the LiDAR radiation emitted by laser 10, the radiation, before striking monitor diode 40, passing through an optical filter element 42 which has a passband 42' with a clearly assignable transmission within the wavelength working range of laser 10, and a means for determining a measure of deviation 48, designed to determine a measure for the deviation from the actual wavelength to the setpoint wavelength from the intensity determined on monitor diode 40 with the aid of the known transmission behavior of filter element 42. Means for evaluation 22 may preferably also include a second monitor diode 44 configured to determine, independently of wavelength, the intensity of the diverted portion of LiDAR radiation emitted by laser 10, i.e., in particular without an upstream filter element.

Figure 6:
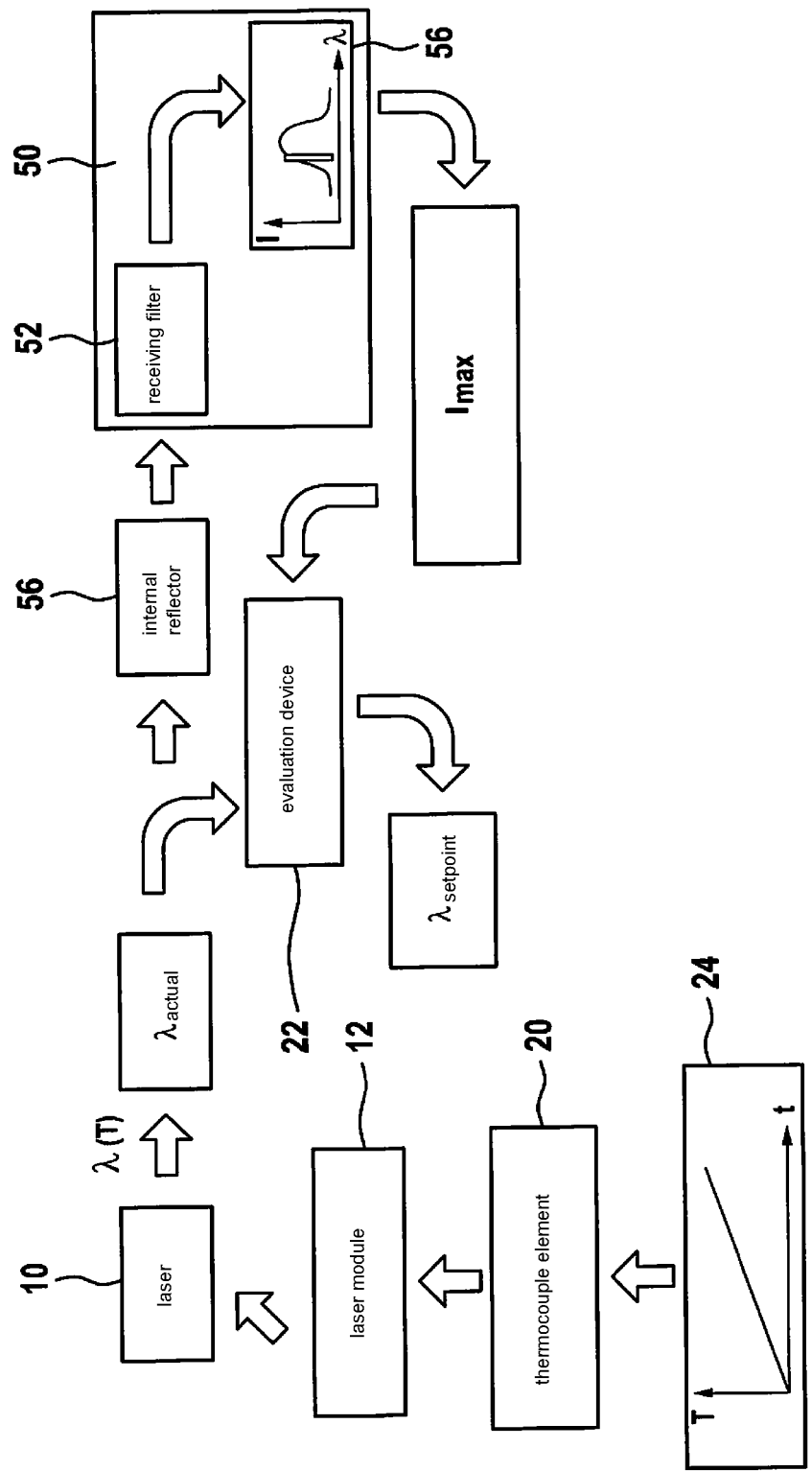
FIG. 6 shows a schematic diagram of a first specific embodiment of an enlargement of a control chain according to the present invention for laser stabilization.

FIG. 6 shows a schematic diagram of a first specific embodiment of an enlargement of a control chain according to the present invention for laser stabilization. The portion of the control chain shown has the function of establishing the setpoint wavelength of laser 10 by measuring receiving filter 52 of a receiver unit 50. For this purpose, the setpoint wavelength is set to the transmission maximum of a receiving filter 52 associated with the LiDAR system, wherein, in a dark phase of the LiDAR system, a portion of LiDAR radiation emitted by laser 10, for example, by an internal reflector 56, being deflected in a detector 54 situated behind receiving filter 52 in a receiver unit 50 associated with the LiDAR system, and the wavelength-dependent transmission of receiving filter 52 being measured by sequential wavelength-selective tuning of the LiDAR radiation of laser 10 in the dark phases of the LiDAR system. The LiDAR radiation of laser 10 may be tuned via means for regulation 24 by appropriate regulation of the temperature of thermocouple element 20 (for example, as a linear ramp). Means for evaluation 22 may then establish the optimal setpoint wavelength for the LiDAR system on the basis of the actual wavelength of laser 10 and the measurement-determined transmission maximum of a receiving filter 52 associated with the LiDAR system.

Figure 7:
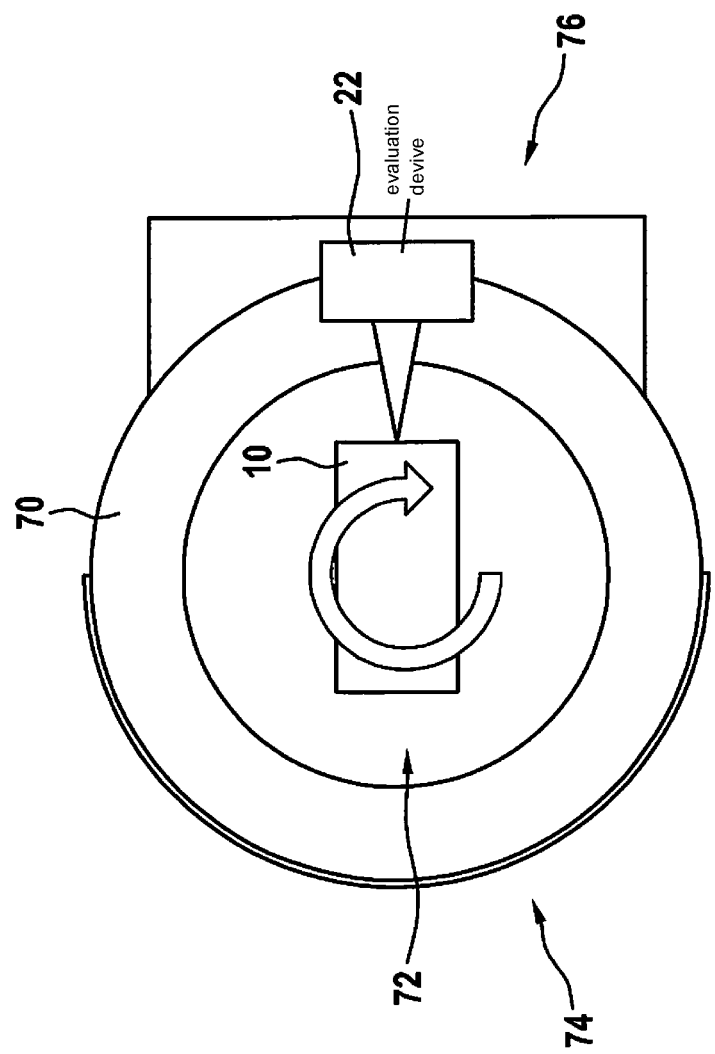
FIG. 7 shows a schematic diagram of a first specific embodiment according to the present invention of a rotating LiDAR system.

FIG. 7 shows a schematic diagram of a first specific embodiment of a rotating LiDAR system according to the present invention. This diagram shows a stator 70 including a front side (and exit window) and a back side 76 as well as a rotor 72, a laser 10 being situated on the rotor. Means for evaluation 22 is situated on the inside of back side 76 of stator 70 facing rotor 72. The determination of a measure for the deviation from an actual wavelength of the radiation to a setpoint wavelength within the wavelength working range of laser 10 is preferably carried out from the radiation emitted by laser 10 via the means for evaluation 22 on stator 70 by emitting a pulse as laser 10 passes over means for evaluation 22. This requires the synchronization of the rotation with the [pulse] bombardment point in time, i.e., means for evaluation 22 is synchronized with the LiDAR scanning. In the LiDAR system shown here, which covers a horizontal scan angle of less than 360° due to the limited range of the vision panel, there is a dark phase in the period of time during which laser 10 is directed to the back side of stator 70 (or of the housing of the LiDAR system).

Figure 8:
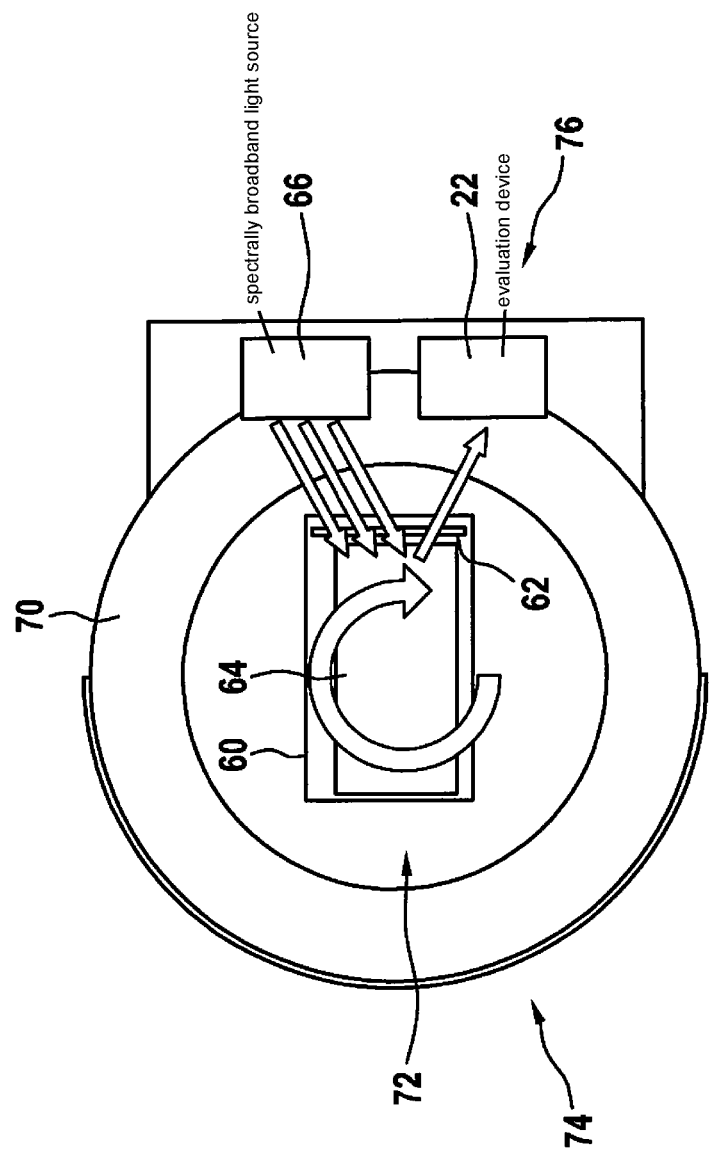
FIG. 8 shows a schematic diagram of a second specific embodiment according to the present invention of a rotating LiDAR system.

FIG. 8 shows a schematic diagram of a second specific embodiment according to the present invention of a rotating LiDAR system. The basic design of the LiDAR system shown corresponds to the diagram in FIG. 7, the corresponding reference numerals and their assignment are applicable accordingly. A receiver unit 60, which includes a receiving filter 62 and a detector 64, is shown on rotor 72. Receiving filter 62 may preferably be a laser line filter. Detector 64 preferably includes a photodiode, a pin diode, an APD or a SiPM.

A portion of the light of a spectrally broadband light source 66 reflected behind receiving filter 62 may be measured spectrally to establish the setpoint wavelength to the transmission maximum of receiving filter 62 associated with the LiDAR system, the spectral band including the wavelength working range of a corresponding laser 10 for determining the transmission maximum of receiving filter 62. The spectral measurement may take place via a means for evaluation 22 according to the present invention. The procedure described for establishing the setpoint wavelength to the transmission maximum of receiving filter 62 associated with the LiDAR system corresponds in this respect to a second specific embodiment of an enlargement of a control chain according to the present invention for laser stabilization. However, its implementation is not bound to rotating LiDAR systems but instead may also be used in other LiDAR constructions accordingly, regardless of the specific embodiment shown in FIG. 8.

What is claimed is:

1. A LiDAR system, comprising:
a laser module having a laser to emit monochromatic LiDAR radiation within a wavelength working range;
a thermocouple element to set a working temperature of the laser;
an evaluation device to determine, from the radiation emitted by the laser, a measure for a deviation from an actual wavelength of the radiation to a setpoint wavelength within the wavelength working range of the laser; and
a regulator to control the thermocouple element on based on the measure of deviation determined by the evaluation device so that the working temperature of the laser is set to a value at which the emitted monochromatic LiDAR radiation corresponds to the setpoint wavelength;
wherein the thermocouple element thermally contacts or directly contacts the laser module, or the thermocouple element is integrated into a laser emitter chip,
wherein a heating or cooling effect of the thermocouple element is transferred to the laser via the laser module,
wherein the evaluation device includes: a plurality of monitor diodes to determine an intensity of a diverted portion of the LiDAR radiation emitted by the laser, the radiation passing through an optical filter element before striking the monitor diodes, which, starting from the setpoint wavelength within the wavelength working range of the laser, have passbands in different spectral directions, the setpoint wavelength being in an ascending portion of the passband of a first filter element of the optical filter element and in a descending portion of the passband of a second filter element of the optical filter element, and
wherein the passband is a filter range whose transmission over an extended wavelength range amounts to at least 2%, and wherein the wavelength range adjacent to the setpoint wavelength is adjacent to a band edge of the passband at one side.

2. The LiDAR system as recited in claim 1, wherein the plurality of monitor diode includes two monitor diodes to determine the intensity of the diverted portion of the LiDAR radiation emitted by the laser, the radiation passing through the optical filter element before striking the two monitor diodes, further comprising:
a deviation determining device to determine a measure for the deviation from the actual wavelength to the setpoint wavelength from the intensities determined on the two monitor diodes with a known transmission behavior of the filter elements.

3. The LiDAR system as recited in claim 2, wherein the deviation determining device is configured to determine, from the intensities determined on the two monitor diodes, a differential signal as a measure of deviation and/or a sum signal for monitoring total power.

4. The LiDAR system as recited in claim 2, wherein the evaluation device additionally includes a third monitor diode configured to determine, independently of wavelength, an intensity of a diverted portion of the LiDAR radiation emitted by the laser.

5. The LiDAR system as recited in claim 1, wherein the evaluation device includes:
a monitor diode to determine an intensity of a diverted portion of the LiDAR radiation emitted by the laser, wherein the radiation, before striking the monitor diode, passes through an optical filter element which includes a passband with a clearly assignable transmission within the wavelength working range of the laser; and
a deviation determining device to determine a measure for a deviation from the actual wavelength to the setpoint wavelength, from the intensity determined on the monitor diode with the known transmission behavior of the filter element.

6. The LiDAR system as recited in claim 5, wherein the evaluation device includes a second monitor diode to determine, independently of wavelength, the intensity of the diverted portion of the LiDAR radiation emitted by the laser.

7. The LiDAR system as recited in claim 1, further comprising:
a sensor to determine a temperature of the laser.

8. The LiDAR system as recited in claim 1, wherein the evaluation device is synchronized with LiDAR scanning.

9. The LiDAR system as recited in claim 1, wherein the passband is a filter range whose transmission over an extended wavelength range amounts to at least 5%.

10. The LiDAR system as recited in claim 1, wherein the passband is a filter range whose transmission over an extended wavelength range amounts to at least 10%.

11. A method for wavelength stabilization for a LiDAR system, the method comprising:
determining a measure for the deviation from an actual wavelength of monochromatic LiDAR radiation to a setpoint wavelength within a wavelength working range of the laser of a laser module, the LiDAR system including a laser configured to emit the monochromatic LiDAR radiation within a wavelength working range, a thermocouple element to set a working temperature of the laser, an evaluation device to determine, from the radiation emitted by the laser, the measure for the deviation from the actual wavelength of the radiation to the setpoint wavelength within the wavelength working range of the laser, and a regulator to control the thermocouple element on based on the deviation determined by the evaluation device so that the working temperature of the laser is set to a value at which the emitted monochromatic LiDAR radiation corresponds to the setpoint wavelength; and controlling the thermocouple element based on the deviation determined in advance, so that the working temperature of the laser is set to a value at which the emitted monochromatic LiDAR radiation corresponds to the setpoint wavelength;

wherein the thermocouple element thermally contacts or directly contacts the laser module, or the thermocouple element is integrated into a laser emitter chip, wherein a heating or cooling effect of the thermocouple element is transferred to the laser via the laser module, and wherein the evaluation device includes: a plurality of monitor diodes to determine an intensity of a diverted portion of the LiDAR radiation emitted by the laser, the radiation passing through an optical filter element before striking the monitor diodes, which, starting from the setpoint wavelength within the wavelength working range of the laser, have passbands in different spectral directions, the setpoint wavelength being in an ascending portion of the passband of a first filter element of the optical filter element and in a descending portion of the passband of a second filter element of the optical filter element, and wherein the passband is a filter range whose transmission over an extended wavelength range amounts to at least 2%, and wherein the wavelength range adjacent to the setpoint wavelength is adjacent to a band edge of the passband at one side.

12. The method as recited in claim 11, further comprising:
establishing the setpoint wavelength to the transmission maximum of a receiving filter associated with the LiDAR system, a portion of the LiDAR radiation emitted by the laser being deflected in a detector situated behind the receiving filter in a receiver unit associated with the LiDAR system and a wavelength-dependent transmission of the receiving filter being measured by sequential wavelength-selective tuning of the LiDAR radiation of the laser in dark phases of the LiDAR system.

13. The method as recited in claim 11, further comprising:
establishing the setpoint wavelength to the transmission maximum of a receiving filter associated with the LiDAR system, a portion of light of a spectrally broad-band light source reflected behind the receiving filter is measured spectrally to determine a transmission maximum of the receiving filter, a spectral band including the wavelength working range of the laser.

14. The method as recited in claim 11, wherein the plurality of monitor diode includes two monitor diodes to determine the intensity of the diverted portion of the LiDAR radiation emitted by the laser, the radiation passing through the optical filter element before striking the two monitor diodes, the evaluation device further comprising:
a deviation determining device to determine a measure for the deviation from the actual wavelength to the setpoint wavelength from the intensities determined on the two monitor diodes with a known transmission behavior of the filter elements.

15. The method as recited in claim 11, wherein the passband is a filter range whose transmission over an extended wavelength range amounts to at least 5%.

16. The method as recited in claim 11, wherein the passband is a filter range whose transmission over an extended wavelength range amounts to at least 10%.

* * * * *